United States Patent
Miyazono

(10) Patent No.: US 10,082,524 B2
(45) Date of Patent: Sep. 25, 2018

(54) PROBER IN WHICH PROBE HEAD OF PROBE CARD IS REPLACED AUTOMATICALLY

(71) Applicant: Tokyo Electron Limited, Tokyo (JP)

(72) Inventor: Mitsuyoshi Miyazono, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 71 days.

(21) Appl. No.: 14/907,616

(22) PCT Filed: Jun. 6, 2014

(86) PCT No.: PCT/JP2014/065664
§ 371 (c)(1),
(2) Date: Jan. 26, 2016

(87) PCT Pub. No.: WO2015/015921
PCT Pub. Date: Feb. 5, 2015

(65) Prior Publication Data
US 2016/0161527 A1    Jun. 9, 2016

(30) Foreign Application Priority Data
Aug. 1, 2013 (JP) ................. 2013-160764

(51) Int. Cl.
*G01R 31/00* (2006.01)
*G01R 1/067* (2006.01)
(Continued)

(52) U.S. Cl.
CPC ...... *G01R 1/06711* (2013.01); *G01R 1/06794* (2013.01); *G01R 1/07314* (2013.01); *G01R 3/00* (2013.01); *G01R 31/2889* (2013.01)

(58) Field of Classification Search
CPC ............ G01R 31/2891; G01R 31/2887; G01R 35/00; G01R 31/2893; G01R 1/07314;
(Continued)

(56) References Cited

U.S. PATENT DOCUMENTS 6,024,629 A * 2/2000 Takekoshi .......... B23Q 3/15526
451/162
6,118,290 A   9/2000 Sugiyama
(Continued)

FOREIGN PATENT DOCUMENTS

JP    64-024437 A    1/1989
JP    07-297242 A    11/1995
(Continued)

OTHER PUBLICATIONS

International Search Report for PCT/JP2014-065664 dated Sep. 16, 2014.

*Primary Examiner* — Vinh Nguyen
(74) *Attorney, Agent, or Firm* — Pearne & Gordon LLP

(57) ABSTRACT

A prober in which a probe head can be easily replaced is provided. A prober 10 includes a main body 12; a stage 11 provided within the main body 12 and configured to place a wafer W thereon; a card 16 provided within the main body 12 to face the stage 11; and a probe head holder 24 provided within the main body 12 and configured to be moved toward the card 16. The card 16 includes a probe head 30 which is detachably attached to the card 16 and has a multiple number of probe needles 35, and the probe head holder 24 is moved toward the card 16 while holding the probe head 30 thereon.

12 Claims, 12 Drawing Sheets

(51) Int. Cl.
*G01R 31/28* (2006.01)
*G01R 1/073* (2006.01)
*G01R 3/00* (2006.01)

(58) Field of Classification Search
CPC .............. G01R 35/005; G01R 1/06794; G01R 1/07378; G01R 31/2846; G01R 1/073; G01R 1/07342; G01R 31/2831; G01R 31/2886; G01R 31/288; G01R 1/06716; G01R 31/2656; G01R 31/2851; G01R 31/2874; G01R 31/316; G01R 3/00
See application file for complete search history.

(56) References Cited

U.S. PATENT DOCUMENTS

| | | | |
|---|---|---|---|
| 6,414,478 | B1 | 7/2002 | Suzuki |
| 7,659,736 | B2 | 2/2010 | Eldridge |
| 2004/0201392 | A1* | 10/2004 | Kim .................. G01R 1/06744 324/750.23 |
| 2005/0012513 | A1 | 1/2005 | Cheng |
| 2006/0132155 | A1* | 6/2006 | Yamada .............. G01R 31/2891 29/844 |
| 2007/0007977 | A1 | 1/2007 | Eldridge |
| 2008/0238463 | A1* | 10/2008 | Takabe ............... G01R 31/2891 324/762.06 |
| 2012/0025859 | A1 | 2/2012 | Huang |
| 2013/0249581 | A1* | 9/2013 | Miyazono .......... G01R 31/2601 324/750.22 |

FOREIGN PATENT DOCUMENTS

| | | |
|---|---|---|
| JP | 10-319076 A | 12/1998 |
| JP | 2007-040926 A | 2/2007 |
| JP | 2009-500633 A | 1/2009 |
| JP | 2010-210478 A | 9/2010 |
| KR | 10-2005-0047060 A | 5/2005 |
| WO | 2007/008790 A2 | 1/2007 |

* cited by examiner

PROBER IN WHICH PROBE HEAD OF PROBE CARD IS REPLACED AUTOMATICALLY

TECHNICAL FIELD

The various embodiments described herein pertain generally to a prober, and, more particularly, to a prober configured to replace a probe head of a probe card automatically.

BACKGROUND ART

A prober is known as a substrate inspection apparatus which inspects electric characteristics of a semiconductor device, such as a power device or a memory, formed on a semiconductor wafer (hereinafter, simply referred to as "wafer") as a substrate.

The prober includes a circular plate-shaped probe card having a multiple number of probe needles; and a stage to be freely moved in upward, downward, leftward and rightward directions while holding the wafer thereon. The prober inspects an electric characteristic of a semiconductor device by bringing the probe needles of the probe card into contact with electrode pads or solder bumps of the semiconductor device and by allowing an inspection current to be flown to the electrode pads or the solder bumps from the probe needles (see, for example, Patent Document 1).

In the prober, since the probe needles of the probe card are brought into contact with the electrode pads or the like repeatedly, tip ends of the probe needles may be worn out. Thus, the probe needles need to be replaced periodically.

Conventionally, to replace the probe needles, the probe card also needs to be replaced, for the probe needles are welded to a wiring within the probe card. Since, however, the probe card is provided within a main body of the prober, it is difficult to replace the probe card. Furthermore, since the probe card is of a high price, it takes high cost to replace the probe card.

In this regard, there has been proposed a prober having a probe head (probe insert) 121 to be detachably attached to a card 120, as shown in FIG. 12 (see, for example, Patent Document 2). In this prober, probe needles 122 are concentrated at the probe head 121, and the probe needles 122 whose tip ends are worn-out can be replaced just by replacing this probe head 121.

Further, to facilitate the replacement of the probe head 121, there has been proposed a method of replacement with a pivotable clamp 123 provided at the card 120. According to this replacement method, if the card 120 is pressed against the probe head 121, as shown in FIG. 13A, the clamp 123 is pivoted down, so that the probe head 121 is held in place, as shown in FIG. 13B.

Furthermore, there has been also proposed another method of replacement with a configuration in which flanges 141 are partially provided at a periphery of a circular plate-shaped probe head 140 (FIG. 14A and FIG. 14D), and a cylindrical clamp 143 partially having flanges 142 at a tip end of the card 120 (FIG. 14A and FIG. 14C) is provided. In this replacement method, the probe head 140 is inserted into the clamp 143 and then is rotated relative to the clamp 143. Accordingly, the flanges 141 of the probe head 140 are engaged with the flanges 142 of the clamp 143, as shown in FIG. 14B and FIG. 14E, so that the probe head 140 is held in place.

However, the card 120 shown in FIG. 13A to FIG. 13B or in FIG. 14A to FIG. 14E is disposed within the main body of the prober, and a working space for an operator is not secured within the main body of the prober. Thus, the card 120 needs to be detached from the prober to replace the probe head 121 or 140 and then attached to the prober again.

Patent Document 1: Japanese Patent Laid-open Publication No. H07-297242

Patent Document 2: Japanese Patent Laid-open Publication No. 2009-500633

DISCLOSURE OF THE INVENTION

Problems to be Solved by the Invention

However, with a recent increase of a diameter of the wafer, the card 120 is also enlarged, and it may have a weight over, e.g., 20 kg. Thus, it is difficult to attach and detach the card 120, which makes it difficult to replace the probe head easily.

In view of the foregoing, exemplary embodiments provide a prober in which a probe head can be easily replaced.

Means for Solving the Problems

In one exemplary embodiment, a prober includes a main body; a stage provided within the main body and configured to place a substrate thereon; and a card, provided within the main body to face the stage, having a probe head which is detachably attached to the card and has a multiple number of probe needles. The prober further includes a moving device provided within the main body and configured to be moved toward the card while holding the probe head thereon.

The moving device may be configured to be rotated about an axis, along which the moving device is moved, as a central axis.

The prober may further include a stocker provided within the main body and configured to accommodate the probe head therein.

The prober may further include a camera configured to detect a position of the moving device. Here, the camera may detect at least one position mark provided on the moving device.

The number of the at least one position mark may be two. Further, the moving device may have a facing surface which faces the card and has the two position marks thereon, and the two position marks may be diagonally arranged on the facing surface.

The moving device may comprise a vacuum attraction device configured to vacuum-attract the probe head, and it may be determined whether it is possible to apply a negative pressure to the vacuum attraction device.

In another exemplary embodiment, a prober includes a main body; a stage provided within the main body and configured to place a substrate thereon; a card, provided within the main body to face the stage, having a probe head which is detachably attached to the card and has a multiple number of probe needles; and a card replacing device configured to be moved toward the card to replace the card. Here, the card replacing device comprises a moving device configured to hold thereon the probe head and to be moved toward the card independently from the card replacing device.

In yet another exemplary embodiment, a prober includes a main body; a stage provided within the main body and configured to place a substrate thereon; and a card, provided within the main body to face the stage, having a probe head which is detachably attached to the card and has a multiple number of probe needles. Here, the stage comprises an adaptor which is configured to be moved toward the card, configured to be detachably attached to the stage and configured to hold thereon the probe head.

The stage may further comprise a vacuum attraction device configured to vacuum-attract the probe head via the adaptor, and it may be determined whether it is possible to apply a negative pressure of the vacuum attraction device.

In still yet another exemplary embodiment, a prober includes a main body; a stage provided within the main body and configured to place a substrate thereon; and a card, provided within the main body to face the stage, having a probe head which is detachably attached to the card and has a multiple number of probe needles. The prober further includes a needle tip polishing device configured to polish a tip end of each of the probe needles of the probe head mounted to the card. Here, the needle tip polishing device comprises an adaptor which is configured to be moved toward the card, configured to be detachably attached to the needle tip polishing device and configured to hold thereon the probe head.

The stage may comprise a vacuum attraction device configured to vacuum-attract the probe head via the adaptor, and it may be determined whether it is possible to apply a negative pressure of the vacuum attraction device.

In still yet another exemplary embodiment, a prober includes a card having a probe head which is configured to be detachably attached to the card and has a multiple number of probe needles. The prober further includes a moving device configured to be moved toward the card while holding the probe head thereon.

Effect of the Invention

According to the exemplary embodiments, since the prober includes the moving device provided within the main body and configured to be moved toward the card while holding the probe head thereon, the probe head can be moved toward the card by the moving device. Thus, it is possible to replace the probe head without an intervention of an operator and without separating the card from the main body. As a result, the probe head can be easily replaced.

According to the exemplary embodiments, the card replacing device includes the moving device configured to hold thereon the probe head and be moved toward the card independently from the card replacing device. Accordingly, the probe head can be moved toward the card by the moving device. Thus, it is possible to replace the probe head without an intervention of an operator and without separating the card from the main body. As a result, the probe head can be easily replaced.

According to the exemplary embodiments, since the stage configured to be moved toward the card includes the adaptor configured to hold the probe head thereon, the probe head held on the adaptor can be moved toward the card by the stage. Thus, it is possible to replace the probe head without an intervention of an operator and without separating the card from the main body. As a result, the probe head can be easily replaced.

According to the exemplary embodiments, since the needle tip polishing device configured to be moved toward the card includes the adaptor configured to hold the probe head thereon, the probe head held on the adaptor can be moved toward the card by the needle tip polishing device. Thus, it is possible to replace the probe head without an intervention of an operator and without separating the card from the main body. As a result, the probe head can be easily replaced.

DETAILED DESCRIPTION

In the following, exemplary embodiments will be described in detail, and reference is made to the accompanying drawings, which form a part of the description.

First, a prober according to a first exemplary embodiment will be described.

Figure 1:
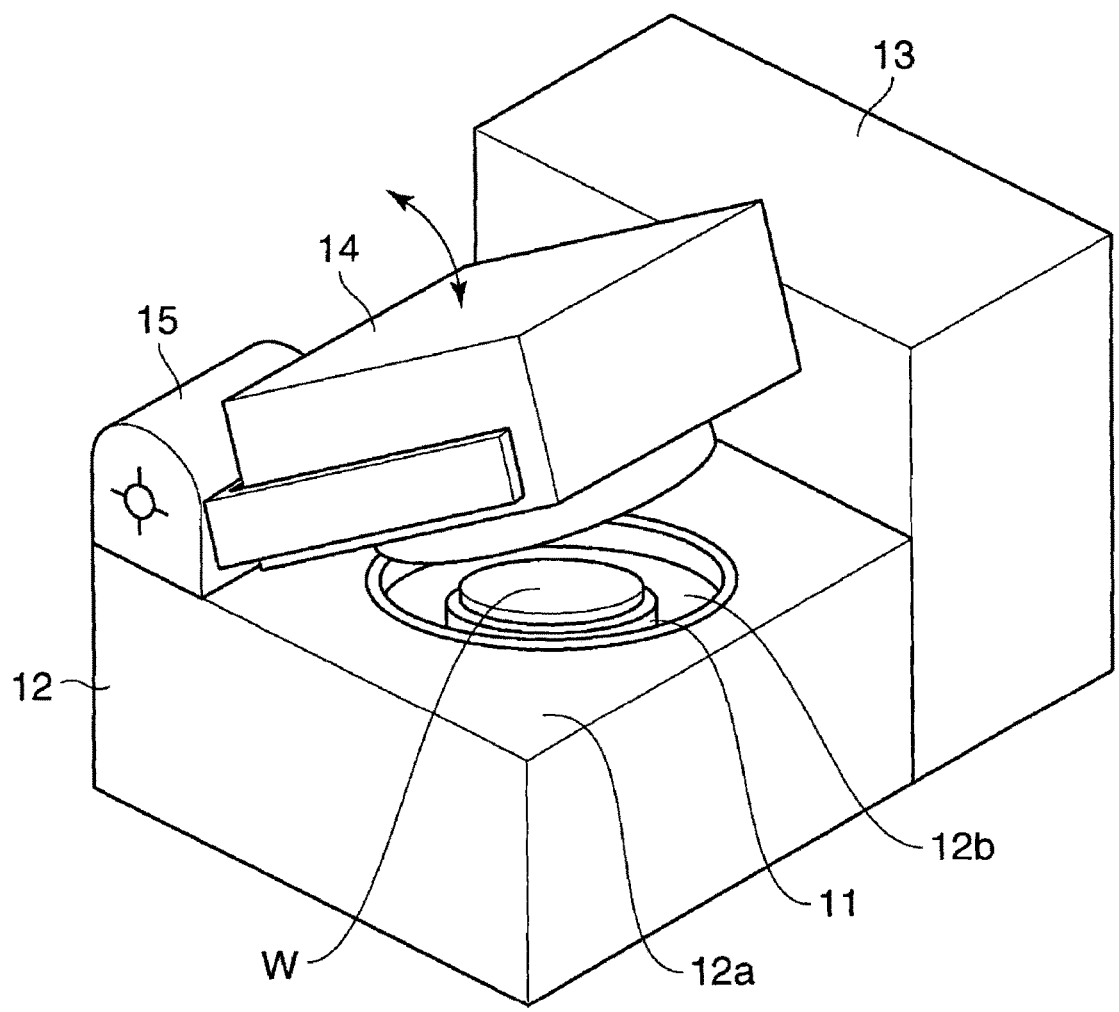
FIG. 1 is a perspective view schematically illustrating a configuration of a prober according to a first exemplary embodiment.

FIG. 1 is a perspective view schematically illustrating a configuration of the prober according to the first exemplary embodiment.

In FIG. 1, the prober 10 includes a main body 12 incorporating therein a stage 11 configured to place a wafer W thereon; a loader 13 provided adjacent to the main body 12; and a test head 14 provided to cover the main body 12. This prober 10 is configured to inspect electric characteristics of a semiconductor device formed on the wafer W having a large diameter ranging from, by way of example, but not limitation, 300 mm to 450 mm.

The main body 12 has a hollow housing shape, and is provided with, at a ceiling portion 12a thereof, an opening 12b which is opened above the wafer W placed on the stage 11. A substantially circular plate-shaped probe card holder (not shown) is fitted into the opening 12b, and the probe card holder holds a circular plate-shaped card 16 (see FIG. 2 to be described later). Accordingly, the card 16 is arranged to face the wafer W placed on the stage 11. The wafer W is vacuum-attracted to the stage 11 by a decompression hole 42 (vacuum attraction device) to be described later such that a relative position of the wafer W with respect to the stage 11 is not deviated.

The test head 14 has a rectangular shape and is configured to be rotatable in an upward direction by a hinge mechanism 15 provided at the main body 12. When the test head 14 covers the main body 12, the test head 14 is electrically connected to the card 16 via a contact ring (not shown). Furthermore, the test head 14 has a data storage unit (not shown) configured to store, as measurement data, electrical signals which are sent from the card 16 and indicate electrical characteristics of a semiconductor device; and a determination unit (not shown) configured to determine presence or absence of an electrical defect of the semiconductor device of the wafer W as an inspection target based on the measurement data.

The loader 13 is configured to take out a wafer W, which has the semiconductor devices thereon and is accommodated in a FOUP (not illustrated) as a transfer container, from the FOUP. Then, the loader 13 places the wafer W on the stage 11 within the main body 12. Further, upon the completion of inspection of electric characteristics of the semiconductor device, the loader 13 carries out the inspected wafer W from the stage 11 and transfers the inspected wafer W back into the FOUP.

The card 16 has a probe head 30 detachably attached thereto, and a multiple number of probe needles 35 (see FIG. 3A or FIG. 4A to be described later) are concentrated at the probe head 30. The stage 11 is configured to allow electrode pads or the like of the semiconductor device to be brought into contact with the probe needles 35 by adjusting relative positions between the card 16 and the wafer W.

When the electrode pads or the like of the semiconductor device are brought into contact with the probe needles 35, the test head 14 flows an inspection current to the semiconductor device via the respective probe needles 35 of the card 16. Then, the card 16 transmits an electric signal indicating the electrical characteristic of the semiconductor device to the data storage unit of the test head 14. The data storage unit stores the received electrical signals as measurement data, and the determination unit determines, based on the stored measurement data, whether or not the semiconductor device as the inspection target has an electrical defect.

Figure 2:
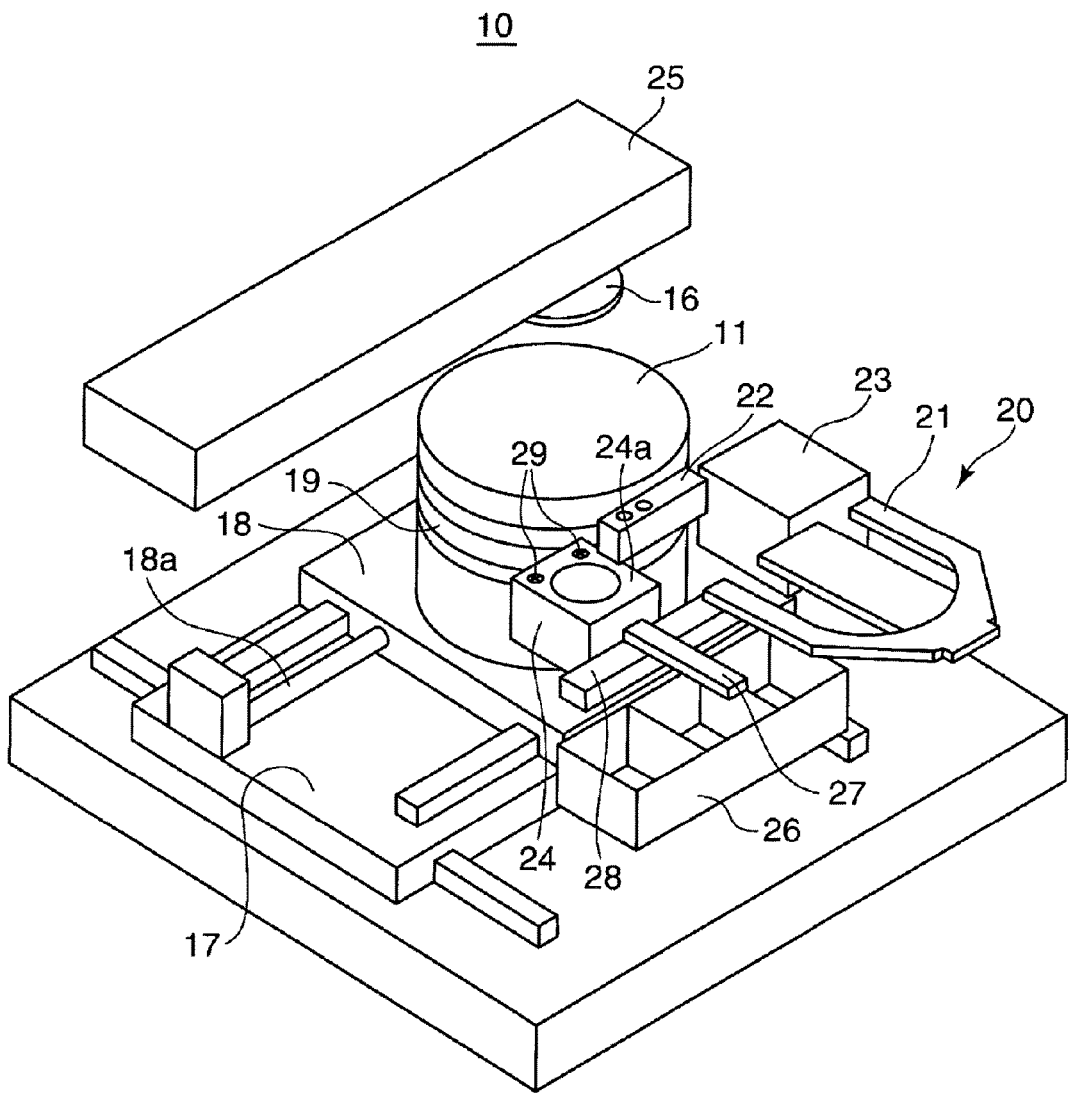
FIG. 2 is a perspective view schematically illustrating an internal configuration of a main body of the prober shown in FIG. 1.
Figure 2:
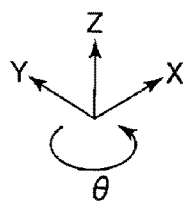

FIG. 2 is a perspective view schematically illustrating an internal configuration of a main body of the prober shown in FIG. 1.

As depicted in FIG. 2, the stage 11 is supported by a Y-directional moving unit 17 configured to be moved along a Y direction shown in the figure, an X-directional moving unit 18 configured to be moved along an X direction shown in the figure, and a Z-directional moving unit 19 configured to be moved along a Z direction shown in the figure to move the stage 11 toward the card 16.

The Y-directional moving unit 17 is driven in the Y direction with high precision through a rotary motion of a ball screw (not shown) provided in the Y-direction. The ball screw is rotated by a Y-directional moving unit motor (not shown) which is a step motor. The X-directional moving unit 18 is driven in the X direction with high precision through a rotary motion of a ball screw 18a provided in the X direction. The ball screw 18a is rotated by an X-directional moving unit motor (not shown) which is a step motor. Further, the stage 11 is configured to be movable in a θ direction on the Z-directional moving unit 19, as shown in the figure, and the wafer W is placed on this stage 11.

That is, the Y-directional moving unit 17, the X-directional moving unit 18 and the Z-directional moving unit 19 are configured to move the stage 11 in the Y direction, the X direction, the Z direction and the θ direction, respectively, so that the stage 11 holding the wafer W thereon is allowed to face the card 16. Particularly, the Z-directional moving unit 19 is configured to move the stage 11 toward the card 16 along the Z direction in the figure, so that the electrode pads or the like of the semiconductor device on the wafer W are allowed to be brought into contact with the probe needles 35.

Within the main body 12, a probe card holder guide 20 (card replacing device) is provided adjacent to the stage 11. The probe card holder guide 20 has a fork 21 having two legs capable of supporting thereon the probe card holder configured to hold the card 16. The probe card holder guide 20 is configured to be movable in the Y and Z directions shown in the figure.

When replacing the card 16, the fork 21 of the probe card holder guide 20 is moved in the Y direction to face the card 16. Then, after moved toward the card 16 along the Z direction, the fork 21 of the probe card holder guide 20 receives the card held by the probe card holder, and then takes the card held by the probe card holder out of the main body 12. The separation of the probe card holder from the main body 12 is conducted by an operator from the outside of the main body 12.

Furthermore, within the main body 12, an ASU camera 22, a needle tip polishing unit 23 (needle tip polishing device) and a probe head holder 24 (moving device) are arranged between the stage 11 and the probe card holder guide 20. Further, an alignment bridge 25 is disposed above the stage 11.

The ASU camera 22, the needle tip polishing unit 23 and the probe head holder 24 are connected to the stage 11 and configured to be moved together with the stage 11 in the X direction and the Y direction. The needle tip polishing unit 23 and the probe head holder 24 are also configured to be movable in the Z direction independently from the stage 11, and the probe head holder 24 is configured to be rotatable in the θ direction with a Z direction axis as a central axis. Further, the alignment bridge 25 is configured to be movable in the Y direction.

The ASU camera 22 is disposed to face the alignment bridge 25, and configured to detect position marks (not shown) provided at the alignment bridge 25 and check an accurate position of the stage 11 within the main body 12. The needle tip polishing unit 23 is configured to be moved toward the card 16 and polish tips of the probe needles 35 provided at the probe head 30 of the card 16. The probe head holder 24 is moved toward the card 16 while holding the probe head 30, and configured to mount the probe head 30 to the card 16 as illustrated in FIG. 3A and FIG. 3B or FIG. 4A and FIG. 4B, or receive the probe head 30 from the card 16. Through this operation, the probe head holder 24 is capable of replacing the probe head 30 of the card 16.

A stocker 26 capable of accommodating a multiple number of probe heads 30 therein is disposed adjacent to the probe head holder 24. A probe head supply unit 28 having an arm 27 is provided between the stocker 26 and the probe head holder 24. The probe head supply unit 28 takes out a probe head 30 to be replaced from the stocker 26 and place it on the probe head holder 24. Further, the probe head supply unit 28 stores the probe head 30 separated from the card 16 and held by the probe head holder 24 in the stocker 26. Since the stocker 26 and the probe head supply unit 28 are arranged in the vicinity of the probe head holder 24 within the main body 12, the probe head 30 to be replaced can be delivered to the probe head holder 24 in a short time period, and, thus, it is possible to replace the probe head 30 in a short time period.

The probe head holder 24 has two position marks 29 on a facing surface 24a facing the alignment bridge 25, and the alignment bridge 25 is equipped with a camera (not shown) which is oriented toward the probe head holder 24. The camera is configured to detect a position of the probe head holder 24 by detecting the position marks 29 of the probe head holder 24. When replacing the probe head 30 by the probe head holder 24, the probe head holder 24 is moved based on the position detected by the camera and is made to face the card 16 straightly.

Figure 3A:
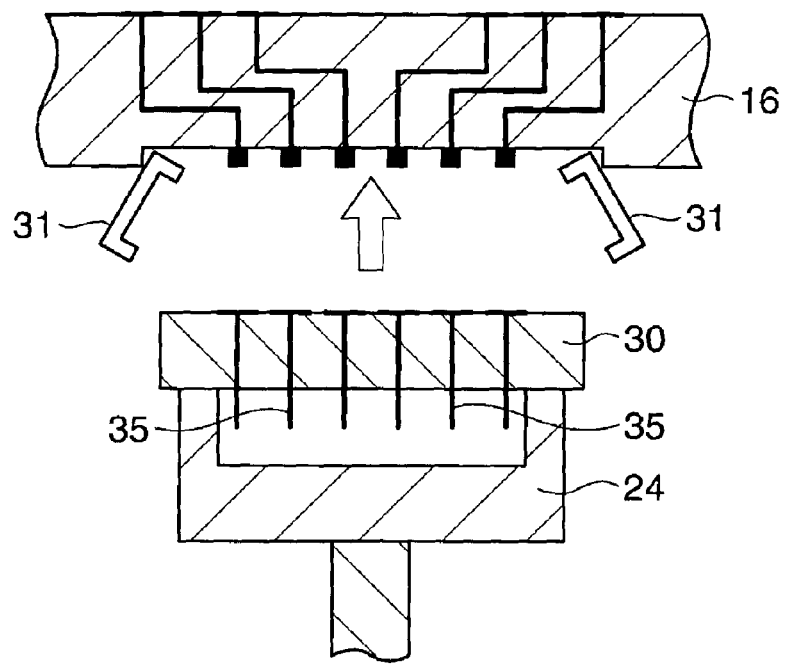
FIG. 3A and FIG. 3B are process diagrams illustrating a method of mounting a probe head to a card in the prober of FIG. 1.
Figure 3B:
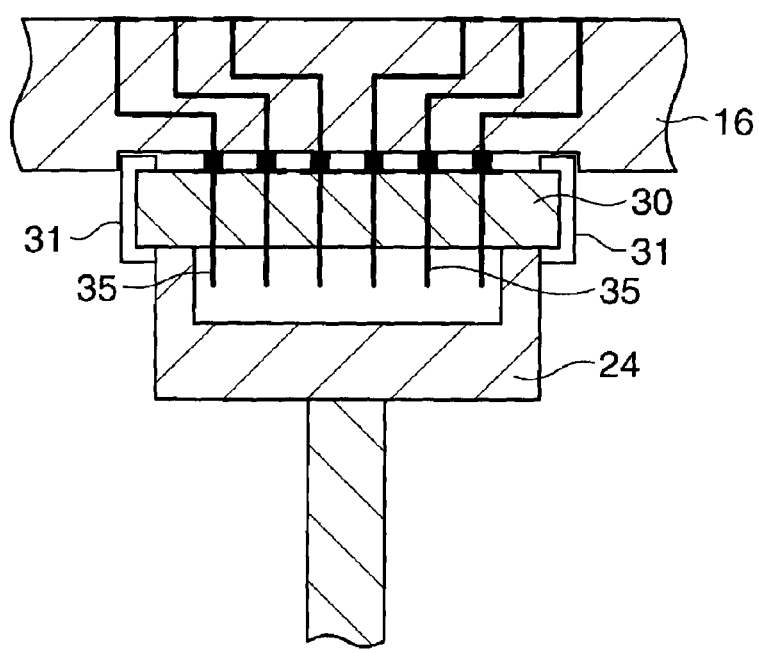

FIG. 3A and FIG. 3B are process diagrams illustrating a method of mounting the probe head to the card in the prober of FIG. 1. In FIG. 3A and FIG. 3B, a pivotable clamp 31 is provided at a position of the card 16 to which the probe head is mounted.

First, the probe head 30 to be replaced is placed on the probe head holder 24 by the probe head supply unit 28, and the probe head holder 24 is moved toward the card 16 in the Z direction shown in FIG. 2 (FIG. 3A).

Subsequently, if the card 16 is pressed against the probe head 30, a part of the probe head 30 comes into contact with the clamp 31, and the clamp 31 is pivoted inwards to hold the probe head 30 in place (FIG. 3B).

Furthermore, when receiving the probe head 30 from the card 16, the reverse processing sequence to that described in FIG. 3A and FIG. 3B is performed. Accordingly, the probe head holder 24 is capable of replacing the probe head 30 with respect to the card 16.

Figure 4A:
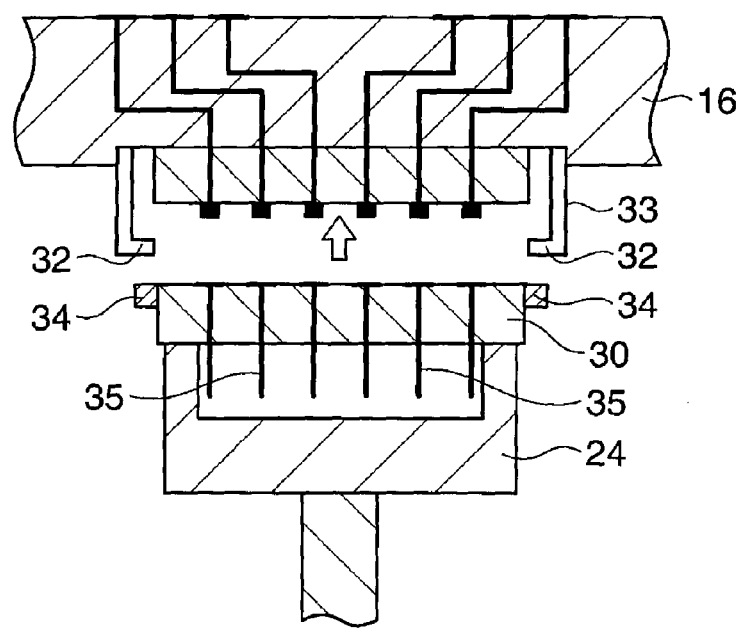
FIG. 4A and FIG. 4B are process diagrams illustrating another method of mounting the probe head to the card in the prober of FIG. 1.
Figure 4B:
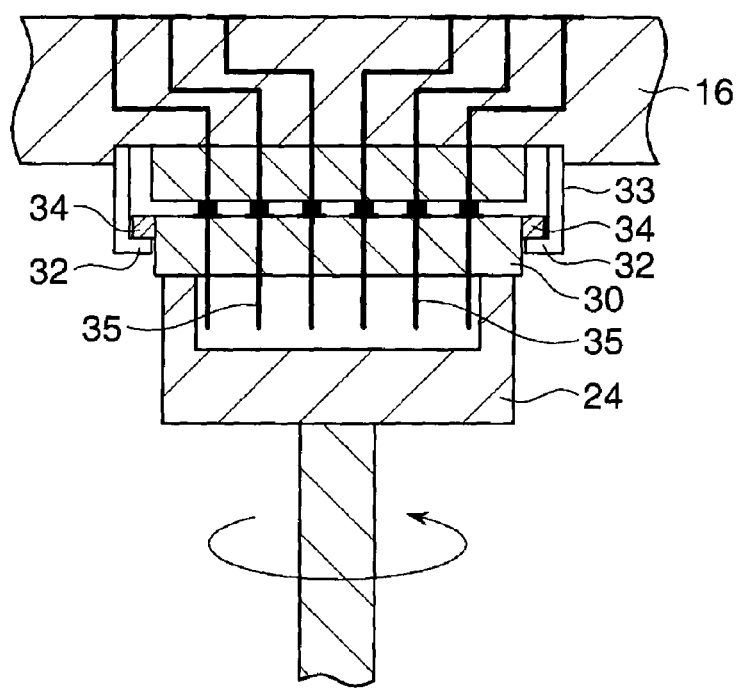

FIG. 4A and FIG. 4B are process diagrams illustrating another method of mounting the probe head to the card in the prober shown in FIG. 1. In FIG. 4A and FIG. 4B, a cylindrical clamp 33 partially having flange 32 at tip ends thereof is provided at a position of the card 16 to which the probe head 30 is mounted. Further, the probe head 30 has flanges 34 partially at a periphery thereof.

First, the probe head 30 to be replaced is placed on the probe head holder 24 by the probe head supply unit 28, and the probe head holder 24 is moved toward the card 16 in the Z direction shown in FIG. 2 (FIG. 4A).

Subsequently, the probe head 30 is inserted into the clamp 33, and then, rotated with respect to the clamp 33 in the θ direction shown in FIG. 2. Accordingly, the flanges 34 of the probe head 30 are engaged with the flanges 32 of the clamp 33, so that the probe head 30 is held in place (FIG. 4B).

Further, in this method as well, in order to receive the probe head 30 from the card 16, the reverse sequence to the method described in FIG. 4A and FIG. 4B is performed. Accordingly, the probe head holder 24 is capable of replacing the probe head 30 with respect to the card 16.

Since the prober 10 in the first exemplary embodiment includes the probe head holder 24 which is provided within the main body thereof and configured to be movable toward the card 16 while holding the probe head 30 thereon, the probe head 30 can be moved toward the card 16 by the probe head holder 24. Thus, it is possible to replace the probe head 30 without needing to separate the card 16 from the main body 12. As a result, the probe head 30 can be replaced easily.

Furthermore, in the above-described prober 10, the probe head 30 can be replaced without an intervention of an operator and the operator need not attach or detach the card 16, which is a heavy object, when replacing the probe head 30. Therefore, a burden on the operation can be relieved, and safety of working can be improved.

Further, in the above-described prober 10, since the probe head holder 24 is provided independently from the stage 11, the probe card holder guide 20, the ASU camera 22 or the needle tip polishing unit 23 that is included in a conventional prober, it is only required to add the probe head holder 24 to the conventional prober to embody the present disclosure. Further, since the added probe head holder 24 only needs to hold a relatively light-weighted small probe head 30, the probe head holder 24 need not have a very robust structure, and, thus, the probe head holder 24 may have a simple structure.

Further, in the above-described prober 10, since the probe head holder 24 is configured to be rotatable in the θ direction around the Z-directional axis in FIG. 2 as the central axis, the probe head 30 can be rotated in the θ direction so that the flanges 34 of the probe head 30 are engaged with the flange 32 of the clamp 33 after the probe head 30 is inserted into the clamp 33 of the card 16. As a result, the probe head 30 can be easily replaced even though it has the flanges 34.

In the above-described prober 10, since the camera of the alignment bridge 25 detects the position marks 29 provided at the probe head holder 24, the position of the probe head holder 24 can be detected accurately, and, thus, the relative position between the probe head holder 24 and the card 16 can be adjusted accurately. As a result, the probe head 30 can be moved by the probe head holder 24 while facing the clamp 33 of the card 16 straightly, so that the replacement of the probe head 30 can be performed securely.

Figure 5:
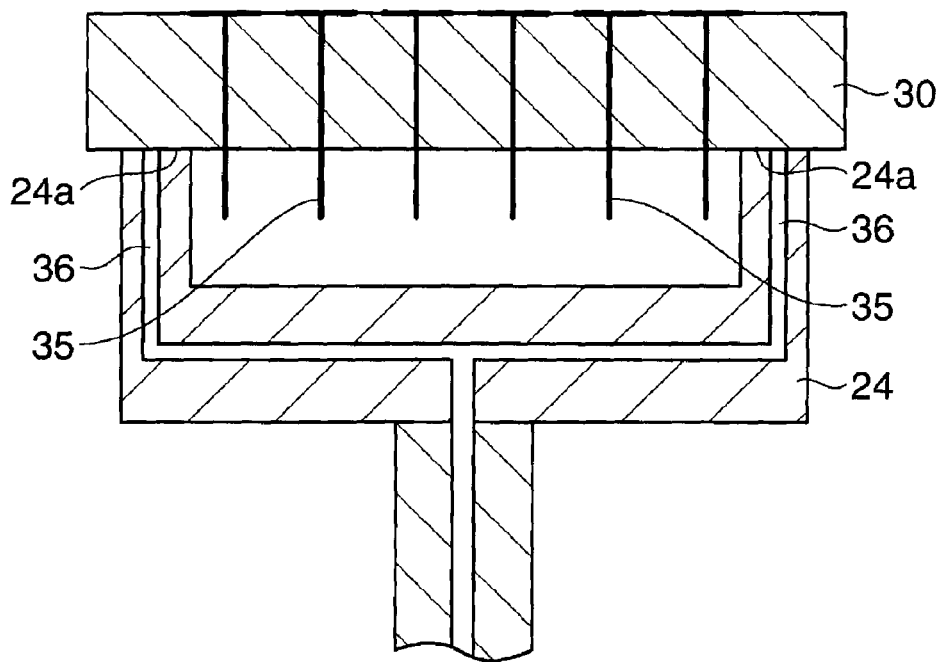
FIG. 5 is a cross sectional view illustrating a configuration of a modification example of a probe head holder of FIG. 2.

Furthermore, in the above-described prober 10, the probe head holder 24 may have a decompression hole 36 (vacuum attraction device) opened at the facing surface 24a thereof, as depicted in FIG. 5. When the probe head 30 is held on the probe head holder 24, the probe head 30 may be vacuum-attracted to the probe head holder 24 by applying a negative pressure to the decompression hole 36. Accordingly, when the probe head holder 24 is moved toward the card 16, the probe head 30 can be suppressed from being relatively deviated from the probe head holder 24.

Moreover, when the probe head holder 24 receives the probe head 30 from the probe head supply unit 28 or the card 16, it may be determined whether it is possible to apply a negative pressure to the decompression hole 36. If it is possible to apply a negative pressure to the decompression hole 36, it implies that the probe head 30 is attracted to and held on the probe head holder 24. Thus, by determining whether it is possible to apply a negative pressure to the decompression hole 36, it can be determined whether the probe head holder 24 has received the probe head 30.

In addition, in a case that the probe head holder 24 is not provided with the decompression hole 36 and the probe head 30 is not vacuum-attracted to the probe head holder 24, it may be desirable to provide a pin at the probe head holder 24 and to provide, at the probe head 30, a pin hole or a notch to be engaged with the pin. As a result, it is possible to suppress the probe head 30 from being relatively deviated from the probe head holder 24.

Figure 6:
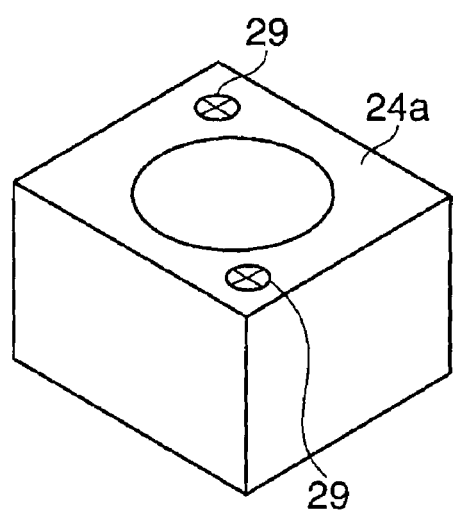
FIG. 6 is a diagram illustrating a modification example of arrangement of position marks of FIG. 2.

In the above-described prober 10, the probe head holder 24 has the two position marks 29 at the facing surface 24a thereof. As depicted in FIG. 6, the two position marks 29 may be diagonally arranged on the facing surface 24a. In this case, by detecting the two position marks 29 with the camera of the alignment bridge 25, the position of the probe head holder 24 in the rotational direction can be detected accurately, so that the relative position between the probe head holder 24 and the card 16 in the rotational direction can be adjusted accurately.

Now, a prober in a second exemplary embodiment will be explained.

A configuration and an operation of the prober according to the second exemplary embodiment are basically the same as those of the first exemplary embodiment except that the probe head holder 24, which is independently provided in the first exemplary embodiment, is not provided in the second exemplary embodiment, and, instead, the probe card holder guide 20 has a probe head holder 38 configured to hold the probe head 30 and be movable toward the card 16. Thus, redundant description of the same configuration and operation will be omitted, and only distinctive configuration and operation will be elaborated.

Figure 7:
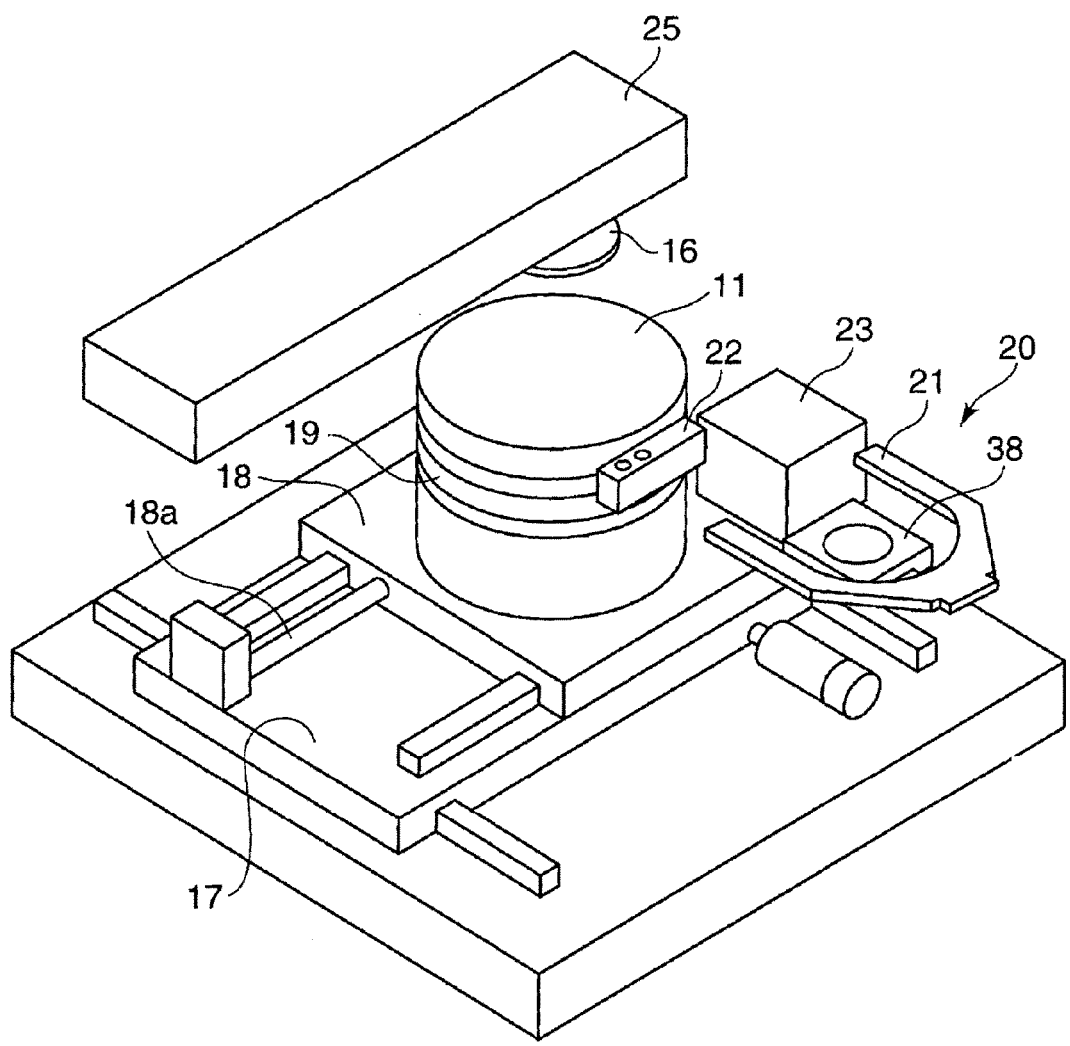
FIG. 7 is a perspective view schematically illustrating an internal configuration of a main body of a prober according to a second exemplary embodiment.
Figure 7:
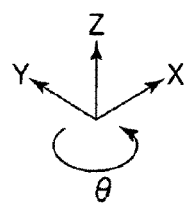

FIG. 7 is a perspective view schematically illustrating an internal configuration of a main body of a prober according to the second exemplary embodiment.

Figure 8A:
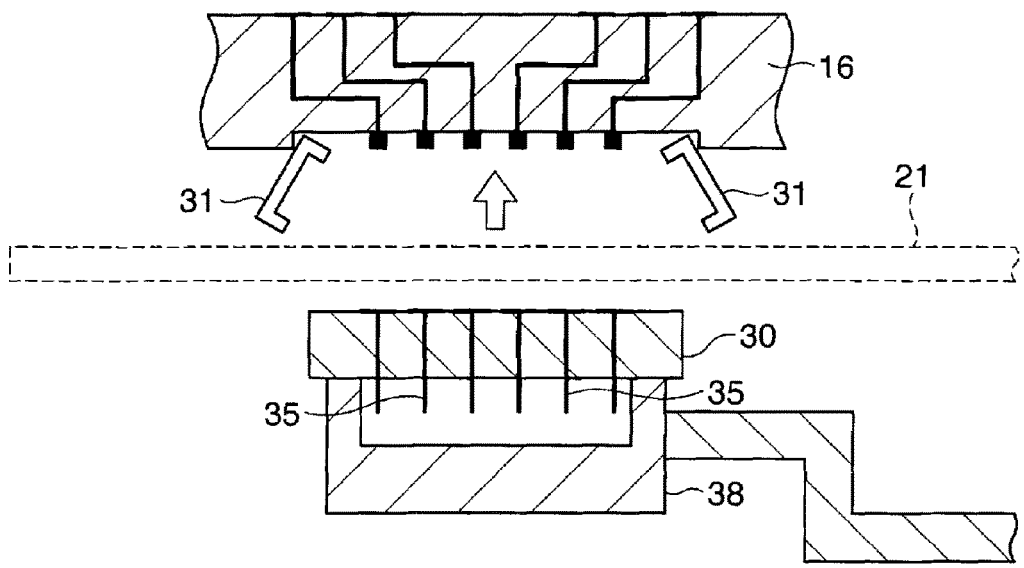
FIG. 8A to FIG. 8C are process diagrams illustrating a method of mounting a probe head to a card in the prober of FIG. 7.
Figure 8B:
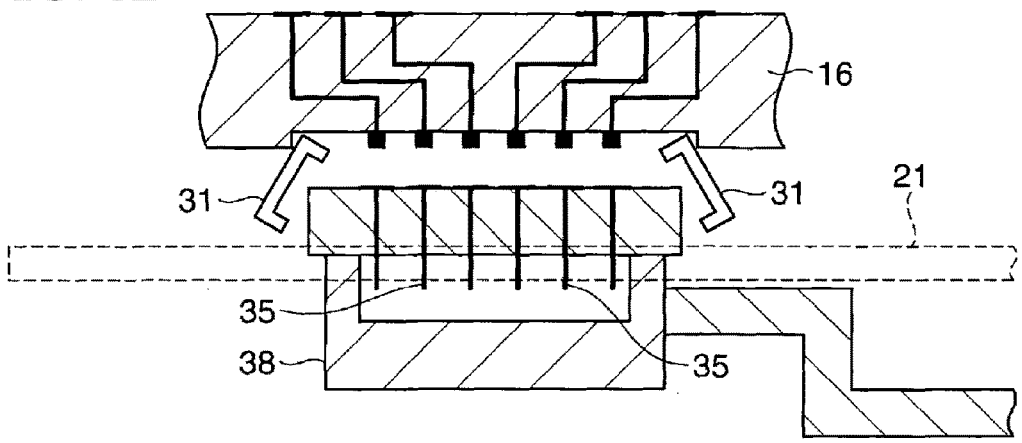
Figure 8C:
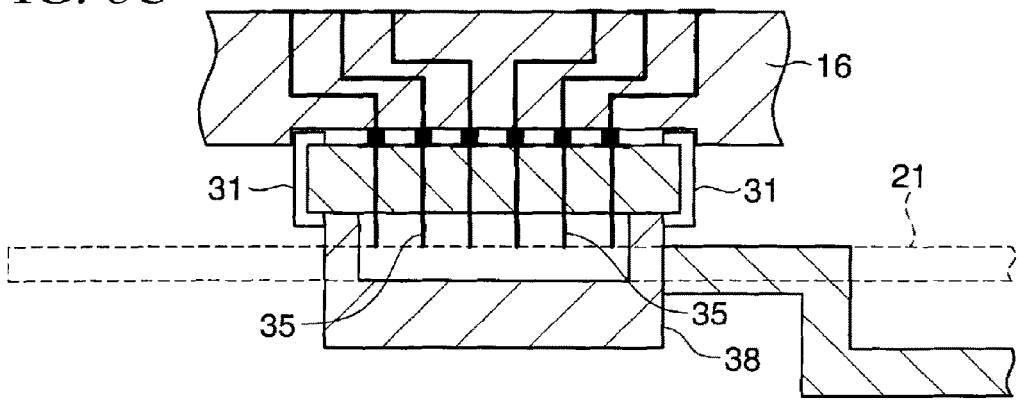

As shown in FIG. 7, a probe card holder guide 20 of the prober 37 is equipped with a probe head holder 38 configured to hold the probe head 30 thereon. The probe head holder 38 is configured to be movable together with the probe card holder guide 20 in a Y direction and in a Z direction, which are indicated in the figure. In the Z direction, the probe head holder 38 is configured to be movable independently from a fork 21 of the probe card holder guide 20. The probe head holder 38 is moved toward the card 16 while holding the probe head 30 thereon. The probe head holder 38 mounts the probe head 30 to the card 16 or receives the probe head 30 from the card 16, as depicted in FIG. 8A to FIG. 8C. In this way, the probe head holder 38 is capable of replacing the probe head 30 with respect to the card 16.

Further, the probe head holder 38 is located at a position below the fork 21 in the Z direction in a normal state, so as not to interfere with the probe card holder when the probe card holder is supported by the probe card holder guide 20.

FIG. 8A to FIG. 8C are process diagrams illustrating a method of mounting the probe head to the card in the prober shown in FIG. 7. In FIG. 8A to FIG. 8C, the pivotable clamp 31 is provided at a position of the card 16 to which the probe head 30 is mounted.

First, the probe head holder 38 is moved along with the probe card holder guide 20 in the Y direction of FIG. 7 and advanced to the outside of the main body 12. Then, the probe head holder 38 receives the probe head 30 from the operator and holds the received probe head 30 thereon.

Thereafter, the probe head holder 38 is moved along with the probe card holder guide 20 again in the Y direction of FIG. 7 and entered into the main body 12. Then, the probe head holder 38 is positioned to face the clamp 31 of the card 16 straightly (FIG. 8A).

Subsequently, the probe head holder 38 is moved toward the card 16 in the Z direction of FIG. 7 independently from the fork 21 of the probe card holder guide 20 (FIG. 8B).

If the card 16 is pressed against the probe head 30, a part of the probe head 30 is brought into contact with the clamp 31, and the clamp 31 is then pivoted inwards to hold the probe head 30 in place (FIG. 8C).

Furthermore, when receiving the probe head 30 from the card 16, the reverse processing sequence to that described in FIG. 8A to FIG. 8C is performed. Accordingly, the probe head holder 38 is capable of replacing the probe head 30 with respect to the card 16.

In the prober 37 according to the second exemplary embodiment, the probe card holder guide 20 includes the probe head holder 38 which is configured to hold the probe head 30 thereon and to be movable toward the card 16 independently from the fork 21 of the probe card holder guide 20. Accordingly, the probe head 30 can be moved toward the card 16 by the probe head holder 38, and, thus, the probe head 30 can be easily replaced.

Furthermore, since the probe head holder 38 is moved along with the probe card holder guide 20 in the Y direction in FIG. 7 to be advanced to the outside of the main body 12, the operator can load the probe head 30 on the probe head holder 38 easily.

Now, a prober according to a third exemplary embodiment will be described.

A configuration and an operation of the prober according to the third exemplary embodiment are basically the same as those of the first exemplary embodiment except that the probe head holder 24, which is independently provided in the first exemplary embodiment, is not provided in the third exemplary embodiment, and, instead, the stage 11 has a probe head adaptor 40. Thus, redundant description of the same configuration and operation will be omitted, and only distinctive configuration and operation will be elaborated.

Figure 9:
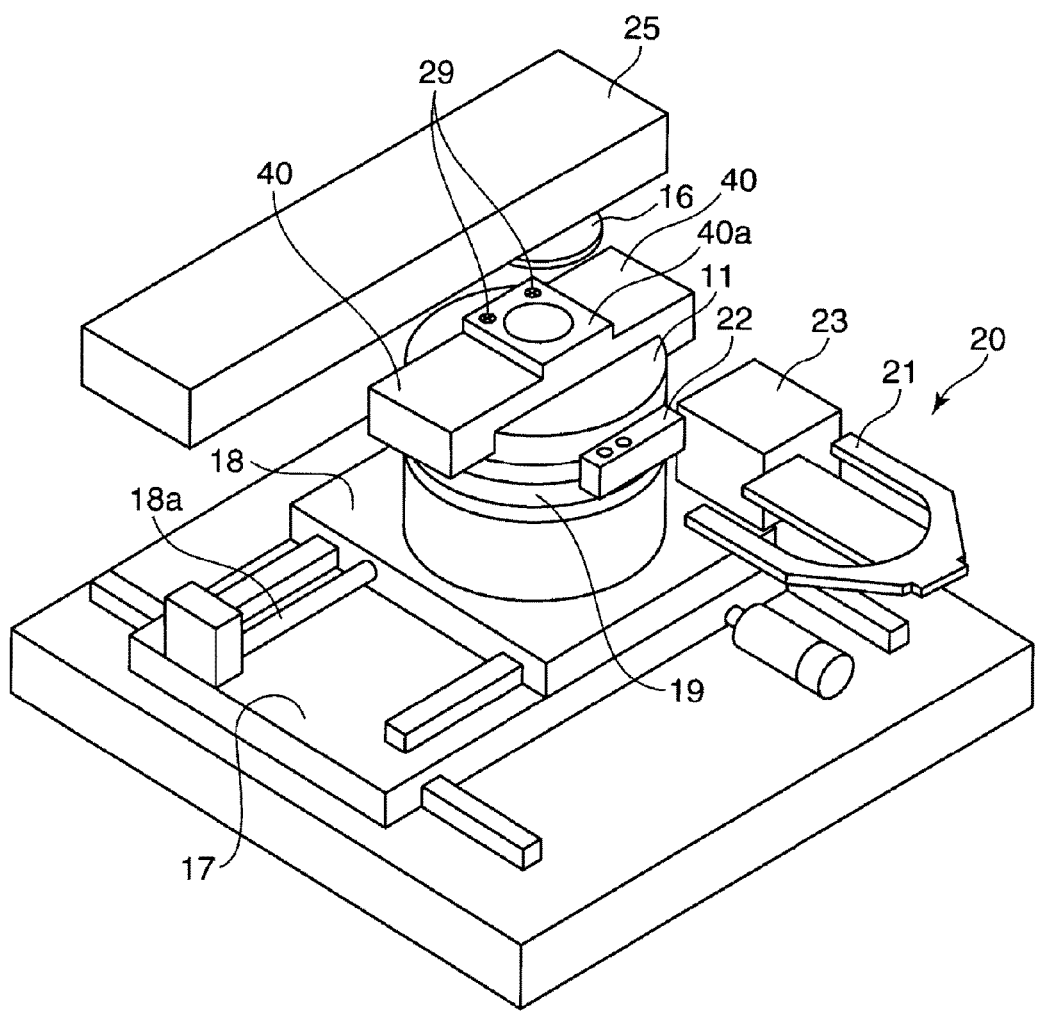
FIG. 9 is a perspective view schematically illustrating an internal configuration of a main body of a prober according to the present exemplary embodiment.
Figure 9:
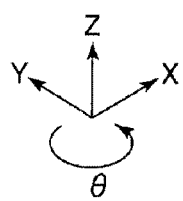

FIG. 9 is a perspective view schematically illustrating an internal configuration of a main body of a prober according to the third exemplary embodiment.

Figure 11A:
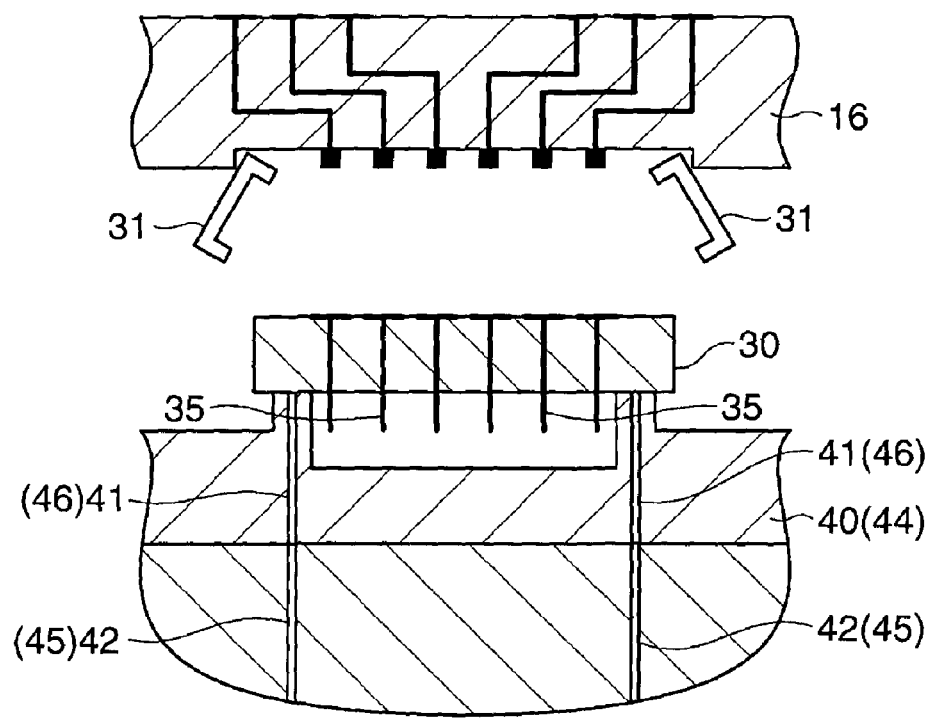
FIG. 11A and FIG. 11B are process diagrams illustrating a method of mounting a probe head to a card in the prober of FIG. 9 and FIG. 10.
Figure 11B:
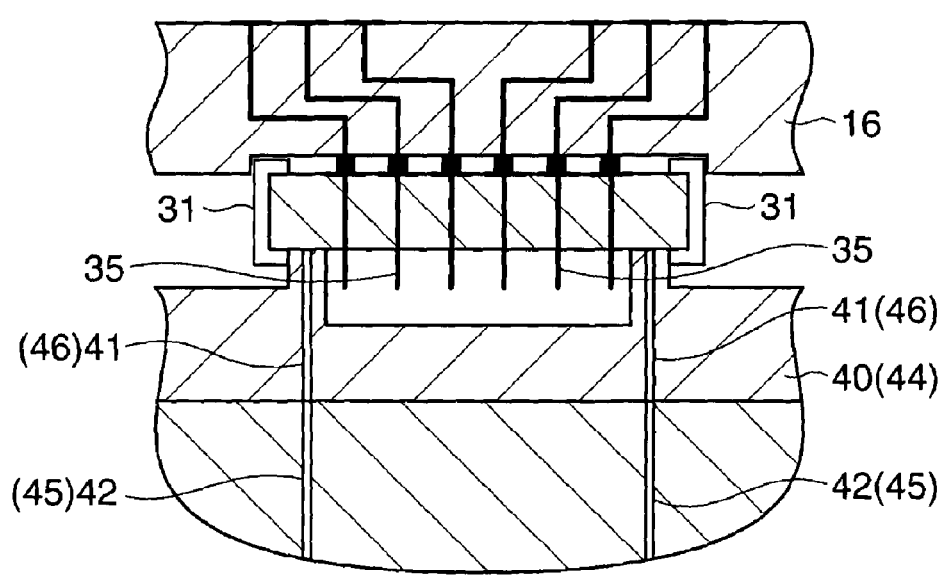
Figure 12:
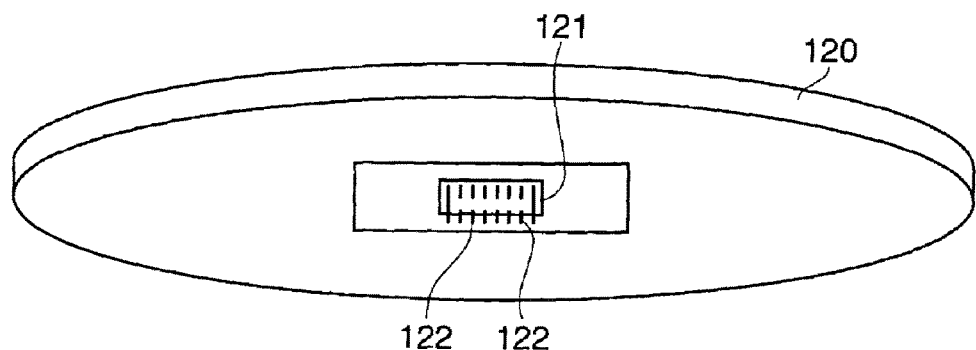
FIG. 12 is a perspective view schematically illustrating a card having a probe head.
Figure 13A:
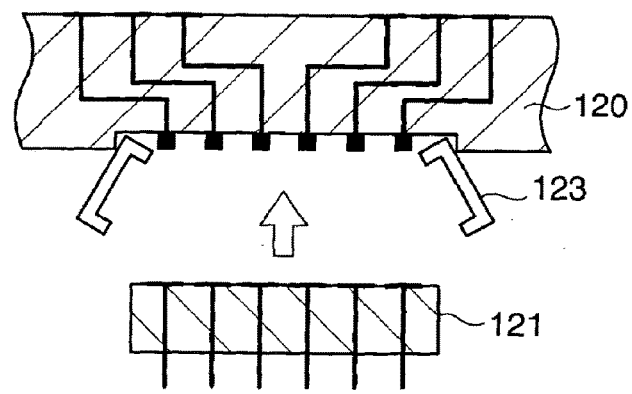
FIG. 13A and FIG. 13B are process diagrams illustrating a method of mounting the probe head to the card of FIG. 12.
Figure 13B:
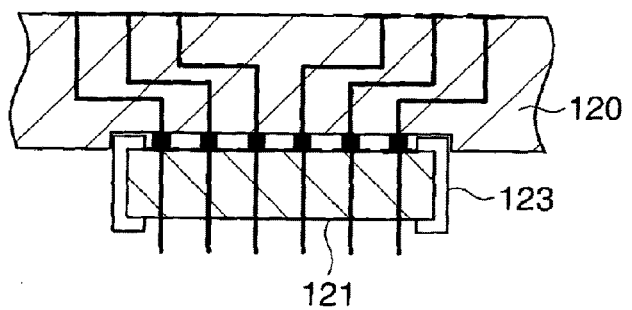
Figure 14A:
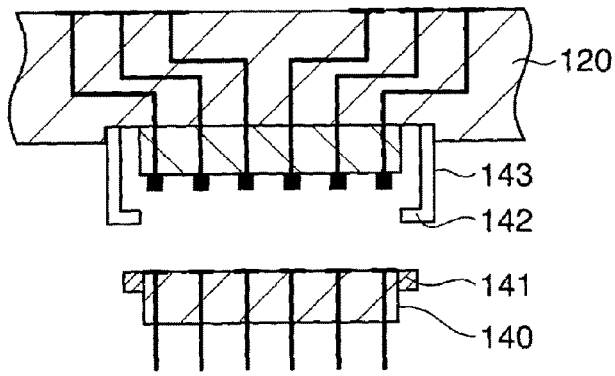
FIG. 14A to FIG. 14E are process diagrams illustrating another method of mounting the probe head to the card of FIG. 12.
Figure 14B:
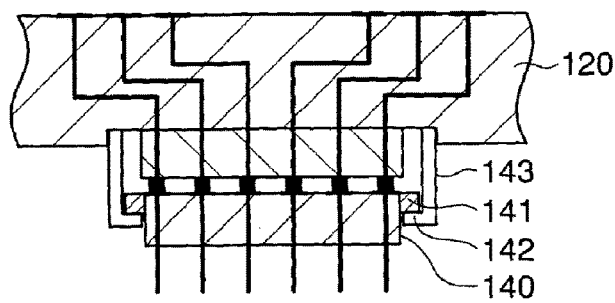
Figure 14C:
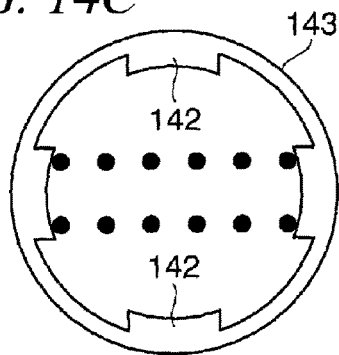
Figure 14D:
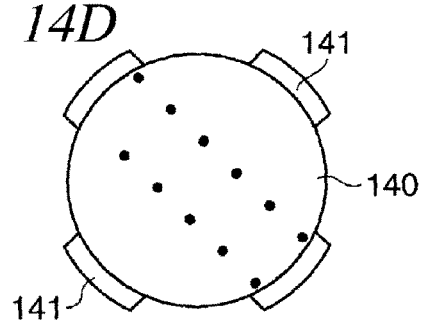
Figure 14E:
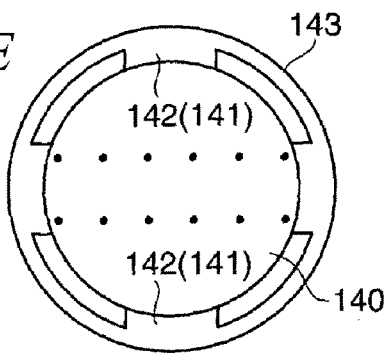

In FIG. 9, the stage 11 of the prober 39 has a probe head adaptor 40 configured to be detachably attached to the stage 11 and capable of holding the probe head 30. The probe head adaptor 40 is provided at a top portion of the stage 11, and is moved along with the stage 11 in an X direction, a Y direction and a Z direction in the figure. Particularly, the probe head adaptor 40 is moved toward the card 16 along with the stage 11 while holding the probe head 30 thereon. The probe head adaptor 40 is configured to mount the probe head 30 to the card 16 or receive the probe head 30 from the card 16, as depicted in FIG. 11A and FIG. 11B. In this way, the probe head adaptor 40 is capable of replacing the probe head 30 with respect to the card 16.

Furthermore, the probe head adaptor 40 has two position marks 29 at a facing surface 40a facing the alignment bridge 25. Each position mark 29 is detected by a camera of the alignment bridge 25, so that a position of the probe head adaptor 40 is detected. To replace the probe head 30 by the probe head adaptor 40, the probe head adaptor 40 is moved based on the position detected by the camera and positioned to face the card 16 straightly. The two position marks 29 may be diagonally arranged on the facing surface 40a.

In addition, the probe head adaptor 40 has a decompression hole 41 (see FIG. 11A to be described later) which is opened on the facing surface 40a thereof and communicates with a decompression hole 42 of the stage 11. When the probe head adaptor 40 holds the probe head 30, the probe head 30 is vacuum-attracted to the probe head adaptor 40 by applying a negative pressure to the decompression hole 41 through the decompression hole 42. Accordingly, when the probe head adaptor 40 is moved toward the card 16, the probe head 30 can be suppressed from being relatively deviated from the probe head adaptor 40. Further, since the probe head adaptor 40 is pressed against the stage 11 by the vacuum-attracted probe head 30, it is also possible to suppress the probe head adaptor 40 from being relatively deviated from the stage 11.

Figure 10:
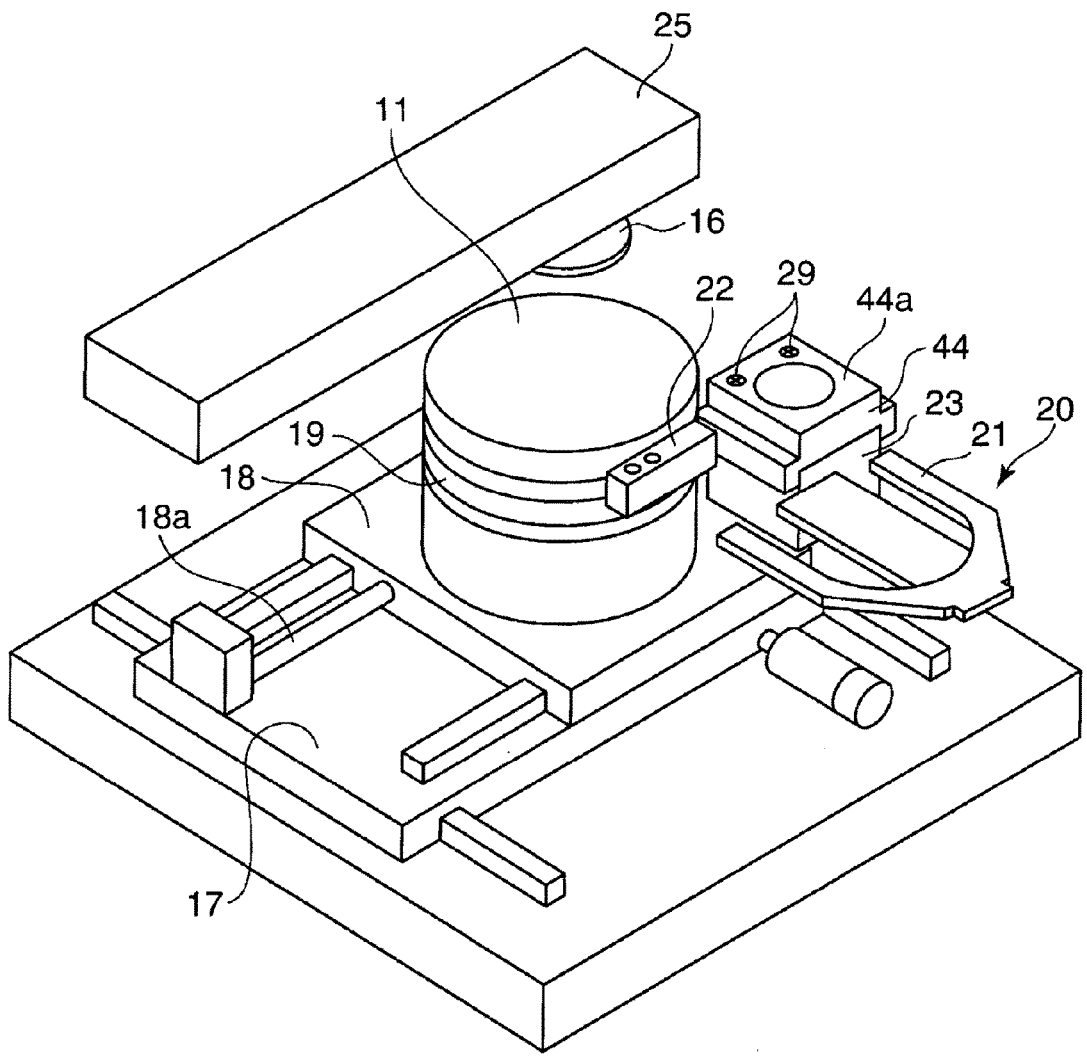
FIG. 10 is a perspective view schematically illustrating an internal configuration of a main body of a prober according to a modification example of the present exemplary embodiment.
Figure 10:
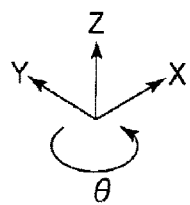

FIG. 10 is a perspective view schematically illustrating a configuration of a main body of a modification example of the prober according to the present exemplary embodiment.

In FIG. 10, a needle tip polishing unit 23 of a prober 43 has a probe head adaptor 44 configured to be detachably attached to the needle tip polishing unit 23 and capable of holding the probe head 30. The probe head adaptor 44 is provided at a top portion of the needle tip polishing unit 23 and is moved along with the stage 11 in an X direction, a Y direction and a Z direction in the figure. Particularly, the probe head adaptor 44 is moved toward the card 16 along with the needle tip polishing unit 23 while holding the probe head 30 thereon, and replaces the probe head 30 with respect to the card 16.

Furthermore, the probe head adaptor 44 has two position marks 29 at a facing surface 44a facing the alignment bridge 25. Each position mark 29 is detected by a camera of the alignment bridge 25, so that a position of the probe head adaptor 44 is detected. To replace the probe head 30 by the probe head adaptor 44, the probe head adaptor 44 is moved based on the position detected by the camera and positioned to face the card 16 straightly. The two position marks 29 may be diagonally arranged at the facing surface 44a.

In addition, the probe head adaptor 44 has a decompression hole 46 (see FIG. 11A to be described later) which is opened on the facing surface 44a thereof and communicates with a decompression hole 45 (vacuum attraction device) of the needle tip polishing unit 23. When the probe head adaptor 44 holds the probe head 30, the probe head 30 is vacuum-attracted to the probe head adaptor 44 by applying a negative pressure to the decompression hole 46 through the decompression hole 45. Accordingly, when the probe head adaptor 44 is moved toward the card 16, the probe head 30 can be suppressed from being relatively deviated from the probe head adaptor 44. Further, since the probe head adaptor 44 is pressed against the needle tip polishing unit 23 by the vacuum-attracted probe head 30, it is also possible to suppress the probe head adaptor 44 from being relatively deviated from the needle tip polishing unit 23.

FIG. 11A and FIG. 11B are diagrams illustrating a method of mounting the probe head to the card in the probers shown in FIG. 9 and FIG. 10. In FIG. 11A and FIG. 11B, the pivotable clamp 31 is provided at a position of the card 16 to which the probe head 30 is mounted. Further, in the following description, a process of mounting the probe head 30 in the prober 39 of FIG. 9 will be mainly explained. Since the same mounting process is performed on the prober 43 of FIG. 10, the process of mounting the probe head 30 in the prober 43 will be explained using parenthesis.

First, the probe head 30 to be replaced is held on the probe head adaptor 40 (probe head adaptor 44), and then, the probe head adaptor 40 (probe head adaptor 44) is moved toward the card 16 in the Z direction in FIG. 9 (FIG. 10) along with the stage 11 (needle tip polishing unit 23) (FIG. 11A).

If the card 16 is pressed against the probe head 30, a part of the probe head 30 is brought into contact with the clamp 31, and the clamp 31 is pivoted inwards to hold the probe head 30 in place (FIG. 11B).

Furthermore, when receiving the probe head 30 from the card 16, the reverse processing sequence to that described in FIG. 11A and FIG. 11B is performed. Accordingly, the probe head adaptor 40 (probe head adaptor 44) is capable of replacing the probe head 30 with respect to the card 16.

In the prober 39 according to the present exemplary embodiment, the stage 11 configured to be movable toward the card 16 includes the probe head adaptor 40 configured to hold the probe head 30. Accordingly, the probe head 30 held on the probe head adaptor 40 can be moved toward the card 16 by the stage 11, and, thus, the probe head 30 can be easily replaced.

Furthermore, in the prober 43 according to the present exemplary embodiment, the needle tip polishing unit 23 configured to be movable toward the card 16 includes the probe head adaptor 44 configured to hold the probe head 30. Accordingly, the probe head 30 held on the adaptor can be moved toward the card 16 by the needle tip polishing unit 23, and, thus, the probe head 30 can be easily replaced.

In the above-described prober 39 or the prober 43, by applying a negative pressure to the decompression hole 41 (decompression hole 46) through the decompression hole 42 (decompression hole 45), the probe head 30 is vacuum-attracted to the probe head adaptor 40 (probe head adaptor 44). Meanwhile, it may be determined whether a negative pressure can be applied to the decompression hole 42 (decompression hole 45) when the probe head adaptor 40 (probe head adaptor 44) receives the probe head 30 from an operator or the card 16. Based on this determination result, it is possible to determine whether the probe head adaptor 40 (probe head adaptor 44) has received the probe head 30.

Furthermore, since the above-described prober 39 or the prober 43 can be constructed just by adding the probe head adaptor 40 or the probe head adaptor 44 to the stage 11 or the needle tip polishing unit 23 included in the conventional prober, the present equipment can be utilized effectively, and waste in equipment investment can be avoided.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

This application claims priority to Japanese Patent Application No. 2013-160764, filed on Aug. 1, 2013, which application is hereby incorporated by reference in its entirety.

EXPLANATION OF REFERENCE NUMERALS

W: wafer
10, 39, 43: Prober
11: Stage
12: Main body
20: Probe card holder guide
23: Needle tip polishing unit
24, 38: Probe head holder
24a, 40a, 44a: Facing surface
26: Stocker
29: Position mark
30: Probe head
35: Probe needle
36, 42, 45: Decompression hole
40, 44: Probe head adaptor

I claim:
1. A prober comprising:
a main body;
a stage provided within the main body and configured to place a substrate thereon;
a card, provided within the main body, and having a surface facing the stage and having therein a multiple number of wirings;
a probe head which is detachably attached to the facing surface of the card and has a multiple number of probe needles;

a moving device provided within the main body and configured to be moved toward the card while holding the probe head thereon, wherein the moving device is configured to mount the probe head to the card or to receive the probe head from the card, and when the probe head is mounted to the card, the multiple number of probe needles are connected to the multiple number of wirings such that the card and the probe head function as a probe card that flows an inspection current to a target device.

2. The prober of claim 1, wherein the moving device is configured to be rotated about an axis, along which the moving device is moved, as a central axis.

3. The prober of claim 1, further comprising a stocker provided within the main body and configured to accommodate the probe head therein.

4. The prober of claim 1, further comprising:

a camera configured to detect a position of the moving device, wherein the camera detects at least one position mark provided on the moving device.

5. The prober of claim 4, wherein the number of the at least one position mark is two, the moving device has a facing surface which faces the card and has the two position marks thereon, and the two position marks are diagonally arranged on the facing surface.

6. The prober of claim 1, wherein the moving device comprises a vacuum attraction device configured to vacuum-attract the probe head.

7. A prober comprising:

a main body;

a stage provided within the main body and configured to place a substrate thereon;

a card, provided within the main body, and having a surface facing the stage and having therein a multiple number of wirings;

a probe head which is detachably attached to the facing surface of the card and has a multiple number of probe needles; and a probe head replacing device configured to be moved toward the card for replacing the probe card, wherein the probe head replacing device comprises a moving device configured to hold thereon the probe head and to be moved toward the card independently from the probe head replacing device, the moving device is configured to mount the probe head to the card or to receive the probe head from the card, and when the probe head is mounted to the card, the multiple number of probe needles are connected to the multiple number of wirings such that the card and the probe head function as a probe card that flows an inspection current to a target device.

8. A prober comprising:

a main body;

a stage provided within the main body and configured to place a substrate thereon;

a card, provided within the main body, and having a surface facing the stage and having therein a multiple number of wirings; and a probe head which is detachably attached to the facing surface of the card and has a multiple number of probe needles, wherein the stage comprises an adaptor which is configured to be moved toward the card, configured to be detachably attached to the stage and configured to hold thereon the probe head, and the adaptor is configured to mount the probe head to the card or to receive the probe head from the card, and when the probe head is mounted to the card, the multiple number of probe needles are connected to the multiple number of wirings such that the card and the probe head function as a probe card that flows an inspection current to a target device.

9. The prober of claim 8, wherein the stage further comprises a vacuum attraction device configured to vacuum-attract the probe head via the adaptor.

10. A prober comprising:

a main body;

a stage provided within the main body and configured to place a substrate thereon;

a card, provided within the main body, and having a surface facing the stage and having therein a multiple number of wirings;

a probe head which is detachably attached to the facing surface of the card and has a multiple number of probe needles; and a needle tip polishing device configured to polish a tip end of each of the probe needles of the probe head mounted to the card, wherein the needle tip polishing device comprises an adaptor which is configured to be moved toward the card, configured to be detachably attached to the needle tip polishing device and configured to hold thereon the probe head, and the adaptor is configured to mount the probe head to the card or to receive the probe head from the card, and when the probe head is mounted to the card, the multiple number of probe needles are connected to the multiple number of wirings such that the card and the probe head function as a probe card that flows an inspection current to a target device.

11. The prober of claim 10, wherein the stage comprises a vacuum attraction device configured to vacuum-attract the probe head via the adaptor.

12. A prober comprising:

a card having a surface facing a stage configured to place a substrate thereon and having therein a multiple number of wirings;

a probe head which is configured to be detachably attached to the facing surface of the card and has a multiple number of probe needles; and a moving device configured to be moved toward the card while holding the probe head thereon, wherein the moving device is configured to mount the probe head to the card or to receive the probe head from the card, and when the probe head is mounted to the card, the multiple number of probe needles are connected to the multiple number of wirings such that the card and the probe head function as a probe card that flows an inspection current to a target device.

* * * * *